United States Patent [19]

Fong et al.

[11] Patent Number: 5,315,472
[45] Date of Patent: May 24, 1994

[54] GROUND RING/SPARK GAP ESD PROTECTION OF TAB CIRCUITS

[75] Inventors: Jon J. Fong, San Diego; William B. Reid, Solana Beach, both of Calif.

[73] Assignee: Hewlett Packard Company, Palo Alto, Calif.

[21] Appl. No.: 734,725

[22] Filed: Jul. 23, 1991

[51] Int. Cl.⁵ .............................................. H05F 3/02
[52] U.S. Cl. ...................................... 361/212; 361/220
[58] Field of Search .................... 361/212, 220, 56, 91, 361/111, 117

[56] References Cited

U.S. PATENT DOCUMENTS

| | | | |
|---|---|---|---|
| 3,676,742 | 7/1972 | Russell et al. | 361/56 |
| 4,531,176 | 7/1985 | Beecher, II | 361/212 |
| 4,617,605 | 10/1986 | Obrecht et al. | 361/220 |
| 5,029,041 | 7/1991 | Robinson et al. | 361/220 |

*Primary Examiner*—Jeffrey A. Gaffin

[57] ABSTRACT

An electrostatic discharge structure protection structure formed on an interconnect circuit (20) that includes elongated interconnect lines (13) and interconnect contact pads (17) formed on a dielectric substrate (11) wherein portions of the interconnect circuit are subject to physical contact by a person. The electrostatic discharge protection structure includes an interconnected conductive grounding metallization ground pattern that includes a ground ring pattern (19) adjacent selected edges of the perimeter of the substrate and conductive metallization traces (29) adjacent selected edges of openings in the substrate. The electrostatic discharge protection structure further includes spark gaps (23a, 23b) formed between the interconnect pads and the conductive grounding pattern, and grounding pads (25') exposed by openings in the substrate.

5 Claims, 6 Drawing Sheets

1

GROUND RING/SPARK GAP ESD PROTECTION OF TAB CIRCUITS

BACKGROUND OF THE INVENTION

The subject invention is directed generally to electrostatic discharge protection for electronic circuits, and more particularly to a non-moving electrostatic discharge structure that is readily integrated into the product being protected.

Electronic components that are sensitive to electrostatic discharge (ESD) are utilized in a wide range of products including office equipment such as computers and printers. A common cause of electrostatic discharge is the physical contact or handling by a person of a product containing ESD sensitive electronic components, as in the course of replacing an inkjet print cartridge, for example. In particular, electrostatic charge that may have been accumulated by a person will be discharged upon physical handling of the product. The path of discharge in the product will be the path of least impedance from the location of charge transfer and may include ESD sensitive electronic components.

Known techniques for preventing damage as a result of ESD include the integration of protection circuitry into electronic components, anti-static packaging, shielding covers to prevent contact with conductive elements, and static charge dissipating furnishings such as anti-static rugs and table mats. Considerations with integrating protection circuitry into electronic components include difficulty in achieving the requisite level of protection, and the burden of re-designing existing electronic components, particularly those that include integrated circuits. Anti-static packaging and shielding covers add cost, and moreover cease to afford ESD protection after removal. The use of static dissipating furnishings can be burdensome and therefore not readily implemented, and moreover may not provide sufficient ESD protection.

SUMMARY OF THE INVENTION

It would therefore be an advantage to provide a non-moving electrostatic discharge protection structure that is external to the electronic components being protected.

Another advantage would be to provide a non-moving electrostatic discharge protection structure that is readily integrated into an existing product without re-designing the electronic components of the product.

The foregoing and other advantages are provided by the invention in an electrostatic discharge structure protection structure formed on an interconnect circuit that includes elongated interconnect lines and interconnect contact pads formed on a dielectric substrate wherein portions of the interconnect circuit are subject to physical contact by a person. The electrostatic discharge protection structure includes an interconnected conductive grounding pattern that includes perimeter conductive grounding areas adjacent selected edges of the perimeter of the substrate and conductive areas adjacent selected edges of openings in the substrate. Spark gaps between the interconnect pads and the perimeter grounding areas provide for low impedance discharge paths to the perimeter grounding areas. The spark gaps can be formed between each interconnect pad and either the perimeter grounding areas or grounding pads conductively connected to the perimeter grounding areas. The spark gaps can also include serially cascaded spark gaps formed between adjacent interconnect pads, with one of the interconnect pads having a spark gap formed between itself and a perimeter grounding area or a grounding pad conductively connected to the perimeter grounding area.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
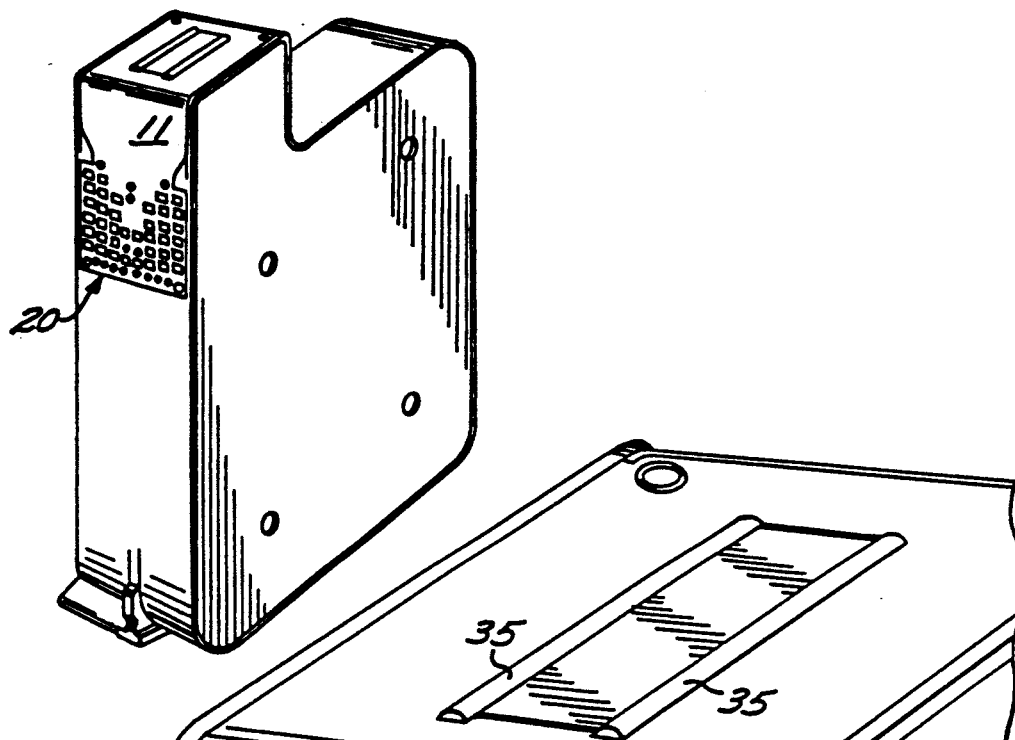
FIG. 1 is a perspective view of an inkjet print cartridge which includes a flexible interconnect circuit in which an illustrative example of an ESD protection structure in accordance with the invention can be implemented.

In the following detailed description and in the several figures of the drawing, like elements are identified with like reference numerals.

Referring now to FIG. shown therein is a print cartridge for an ink jet printer. The print cartridge contains ink reservoirs and an integrated circuit printhead that includes an orifice plate 11 having a plurality of nozzles. The print cartridge further includes a flexible "tab" circuit 20 which allows for electrical connection of the printhead to the ink jet printer in which the cartridge is installed.

Figure 2:
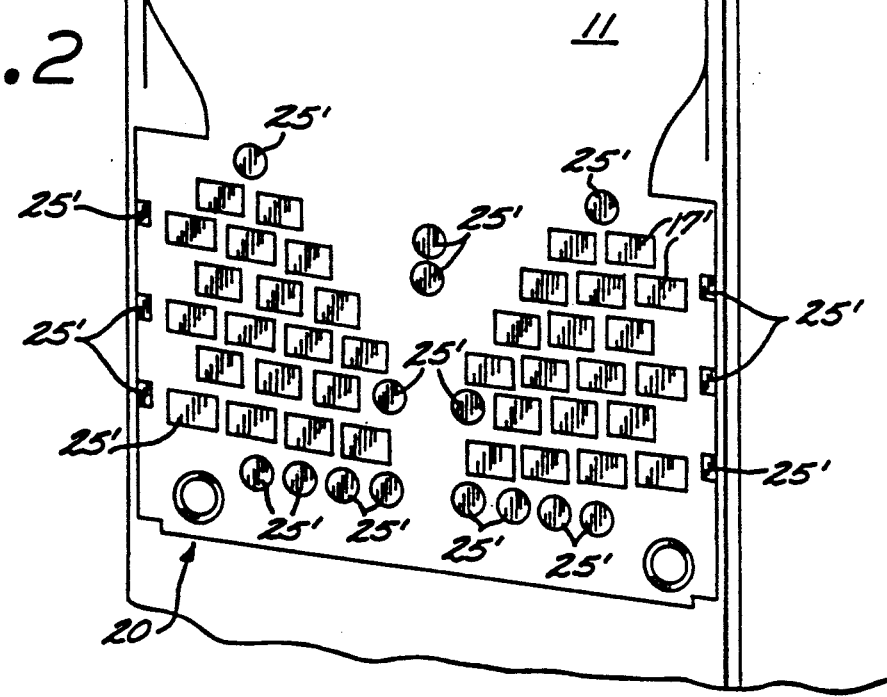
FIGS. 2 schematically illustrates the metallization areas of the flexible interconnect circuit of the print cartridge of FIG. I which are exposed by openings in the substrate of the flexible interconnect circuit, as viewed from the outside the flexible interconnect circuit as it is installed on the print cartridge.

The "tab" circuit 20 is a lead frame type of flexible or "flex" circuit that generally comprises a flexible planar dielectric substrate or film 11 having a metallization pattern formed on one surface thereof pursuant to sputter deposition and photolithographic etching, for example. The side of the flexible interconnect circuit that contains the metallization is against the print cartridge when installed thereon and is herein called the back side or printed side. Selected portions of the metallization pattern are exposed on the front side of the tab circuit 20 by means of openings in the substrate 11 which are formed by etching, for example, as generally shown in FIG. 2 which for ease of illustration shows only the metallization that is exposed on the front side of the tab circuit 20 although the substrate 11 can be transparent.

Figure 3:
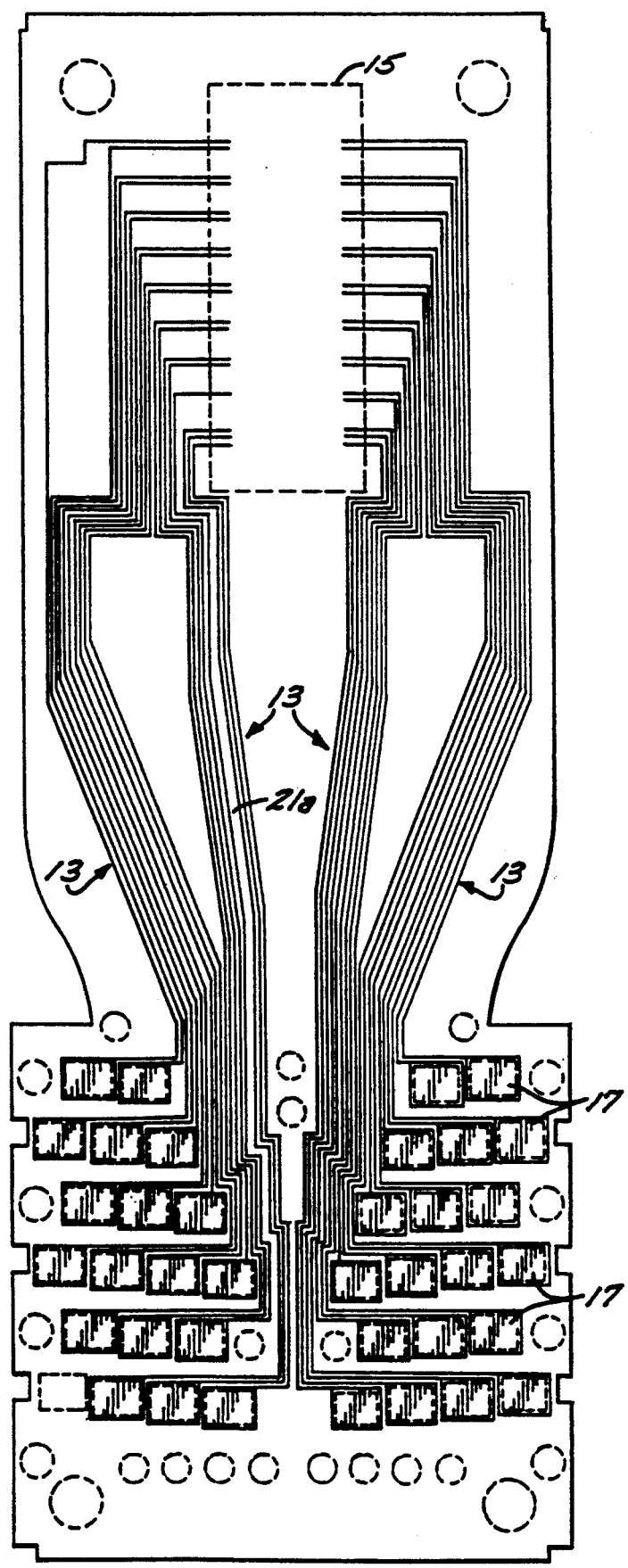
FIG. 3 schematically illustrates the interconnect metallization of the flexible interconnect circuit in which an ESD protection structure in accordance with the invention can be implemented, as viewed through the substrate of the flexible interconnect circuit.
Figure 4A:
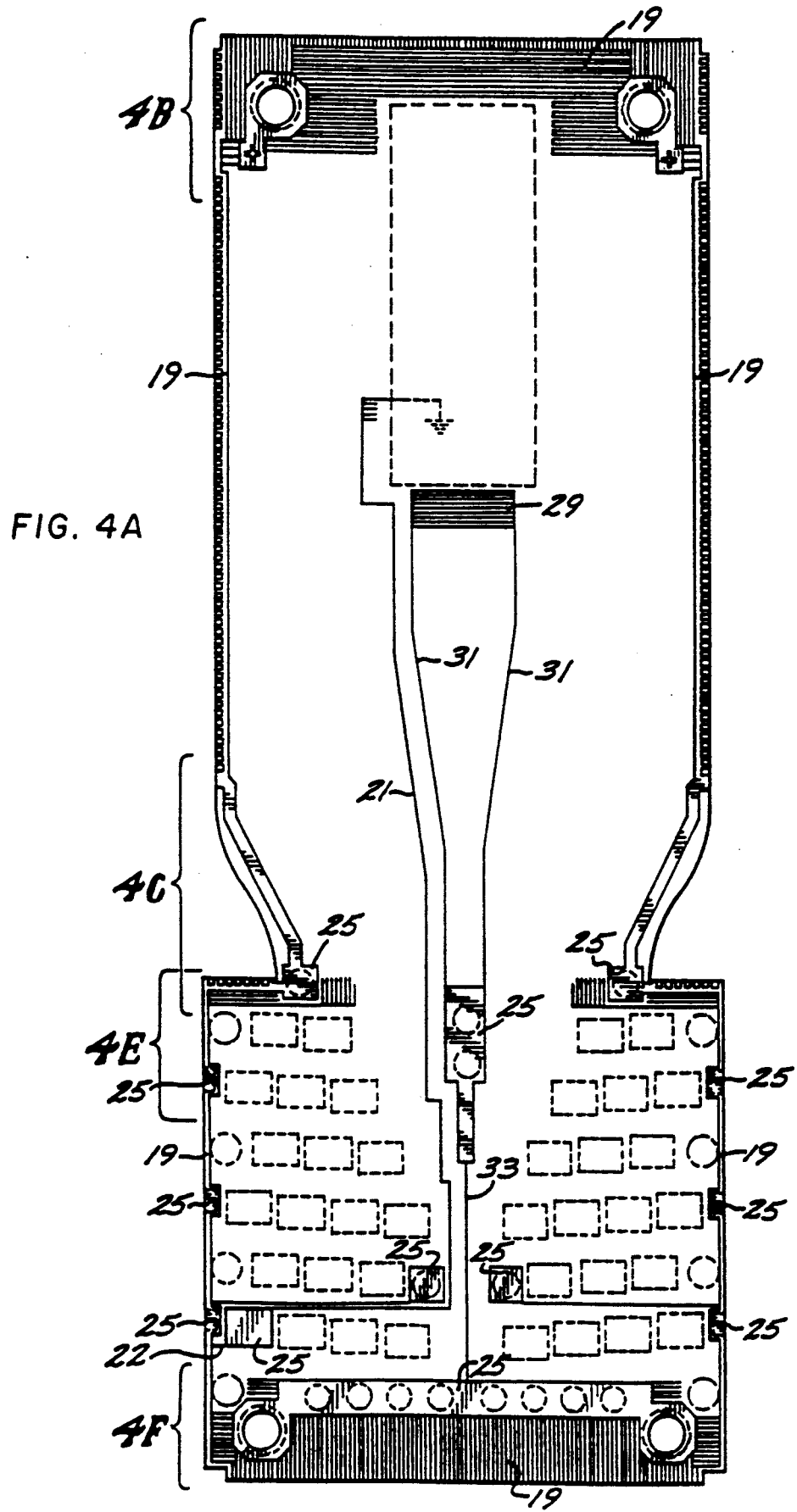
FIG. 4A schematically illustrates the metallization of grounding components of an ESD protection structure in accordance with the invention implemented in the flexible interconnect circuit, as viewed through the substrate of the flexible interconnect circuit.

For ease of reference and understanding, the metallization on the back side of the tab circuit 20 which implements an illustrative example of an ESD protection structure in accordance with the invention has been separated into two groups as shown in FIGS. 3 and 4A and in the detail views of FIGS. 4B through 4E. FIG. 3 shows the metallization pattern that provides the interconnect functions, while FIG. 4A shows the metallization pattern of conductive grounding components located adjacent the edges of the substrate perimeter and adjacent selected edges of openings in the substrate, as well as other grounding components. The entire metallization on the reverse side of the tab circuit is comprised of the combination of the metallization shown in FIGS. 3 and 4A with such patterns being separate and unconnected.

Figure 5:
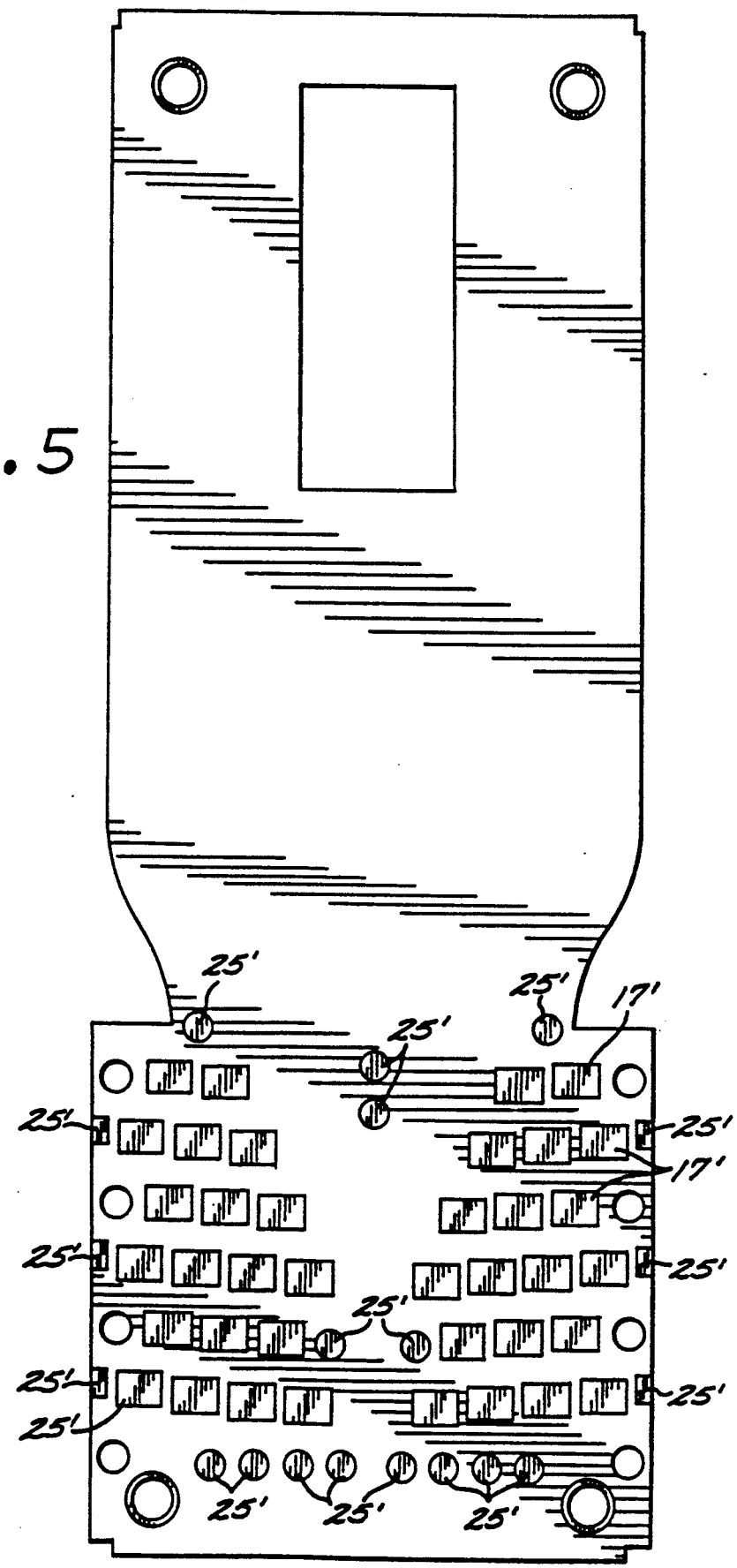
FIG. 5 schematically illustrates the front side of the flexible interconnect circuit of the print cartridge of FIG. 1.

FIG. 5 shows the portions of the metallization pattern that are exposed through openings in the substrate 11, and such exposed portions are identified with primed versions of the reference numerals utilized to identify corresponding areas of the metallization pattern.

Referring in particular to FIG. 3, schematically shown therein is the interconnect portion of the metallization on the back side of the tab circuit 20, as viewed from the front of the tab circuit through the substrate. The interconnect portion of the metallization includes elongated conductive traces, generally indicated by the reference numeral 13, that extend between (a) a printhead opening 15 in the substrate where they are connected to the integrated circuit printhead (not shown) and (b) respective interconnect pads 17 which are exposed on the front side of the tab circuit 20 as indicated by the broken line rectangles within the perimeter of the pads that indicate openings in the substrate 11. Other openings in the substrate are also shown by broken lines.

In use, the portions of the interconnect pads 17 exposed on the front side of the tab circuit (and identified with the reference number 17' in FIG. 5) are engaged with contact elements in the ink jet printer for conducting drive currents for the ink ejecting heater resistors in the integrated circuit printhead. The connections of the interconnect conductive traces to the integrated circuit printhead contact pads are covered or encapsulated for example with an insulating adhesive bead 35 which covers the longitudinal edges of the printhead opening in the flexible substrate 11. At the narrow ends of the printhead opening, the integrated circuit die of the printhead may be exposed and subject to physical contact by a person. ESD protection is provided for the exposed ends of the die as further described herein.

Referring now to FIG. 4A, schematically shown therein is the conductive grounding pattern of the ESD protection structure on the back side of the tab circuit 20, as viewed from the front of the tab circuit through the substrate 11 The conductive grounding pattern includes various interconnected conductive grounding areas and/or traces that are formed on the substrate 11 in the same manner as the interconnect lines 13 and interconnect pads 17, and also spark gaps that provide for discharge paths between the interconnect pads 17 and the ESD conductive grounding pattern.

The conductive grounding pattern particularly includes a conductive ground ring pattern 19 that extends along and is adjacent the perimeter of the substrate 11, and which surrounds the interconnect metallization portion and the print head region shown in FIG. 3. The effective width of the ground ring pattern should be greater than the width of each of the interconnect traces 13. The conductive ground ring pattern 19 is electrically connected to the substrate ground of the printhead via a ground trace 22, a grounding pad 25, and a ground trace 21 that is routed between interconnect lines, as indicated by a gap 21a between interconnect lines in FIG. 3.

The conductive grounding pattern further includes conductive grounding traces and/or areas adjacent exposed edges of openings in the tab circuit substrate which have interconnect circuitry or ESD sensitive components nearby, as for example represented by parallel interconnected traces 29 adjacent a narrow edge of the printhead opening in the circuit substrate, for the particular example of a printhead die having exposed edges. The traces 29 are conductively connected to the ground ring pattern 19 by traces 31, a grounding pad 25, and a conductive trace 33. Conductive grounding traces are similarly provided adjacent the opposite narrow edge of the printhead opening in the substrate, where such conductive grounding traces also form a portion of the ground ring pattern 19. As discussed previously, the interconnect traces and printhead contacts along the longitudinal edges of the printhead opening are encapsulated and not subject to physical contact by a person, and therefore a conductive grounding pattern is not necessary along such unexposed edges.

Essentially, the grounding conductive pattern of the ESD protection structure includes conductive traces and/or areas adjacent perimeter edges of substrate of the tab circuit structure, and adjacent openings in the substrate. The grounding conductive pattern can be limited to those perimeter and opening edges that have interconnect or ESD sensitive components in the proximity thereof and which are unsealed and therefore subject to physical handling and/or ESD discharge.

As discussed more fully herein, one of the functions of the conductive grounding components adjacent perimeter and opening edges is to provide discharge paths to an external ground plane, as for example when the cartridge is placed on a conductive surface. Accordingly, conductive grounding areas and/or traces can be provided adjacent perimeter and interior substrate edges which by virtue of location on the product might provide discharge paths to an external ground plane, regardless of whether interconnect or ESD sensitive components are in the proximity of the edges.

Figure 4B:
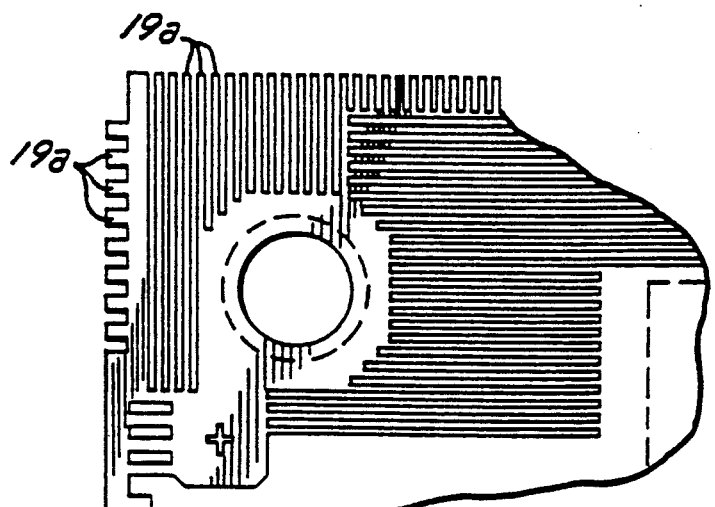
FIG. 4B is a detail view of a portion of the grounding metallization pattern of FIG. 4A.
Figure 4C:
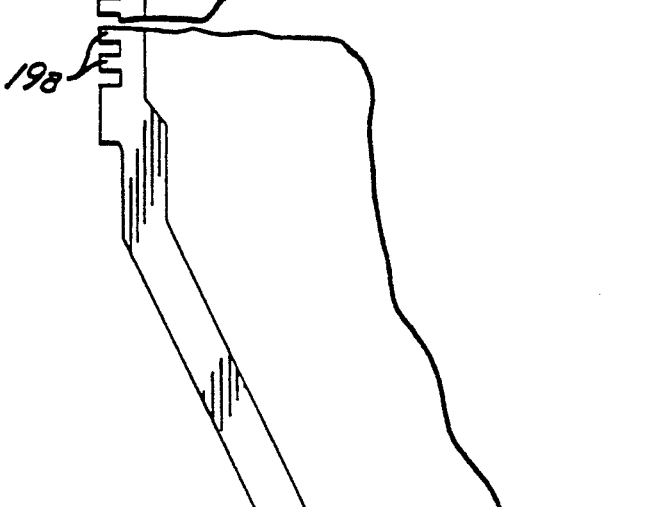
FIG. 4C is a detail view of another portion of the grounding metallization pattern of FIG. 4A.
Figure 4D:
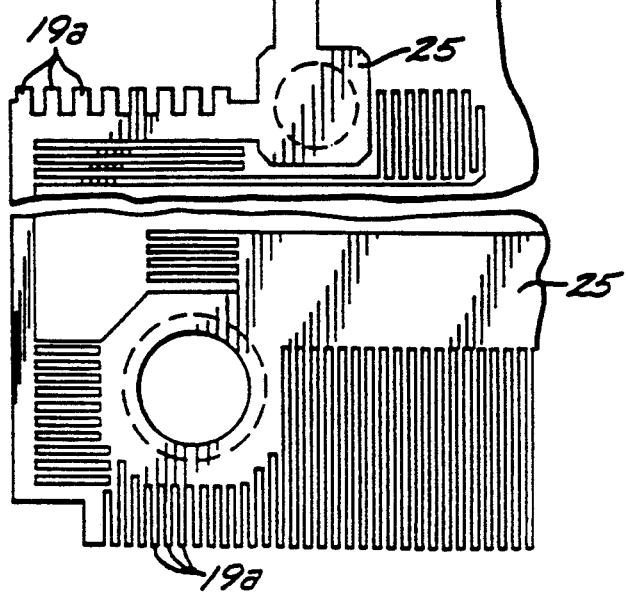
FIG. 4D is a detail view of a further portion of the grounding metallization pattern of FIG. 4A

Referring to the detail views in FIGS. 4B–4D, the conductive ground ring pattern 19 includes a plurality of narrow comb like tabs 19a distributed adjacent and generally normal to certain edges of the tab circuit. These tabs 19a function as field concentrating electrodes that promote discharge of ESD, where such discharge can be to an external ground plane or from physical handling by a person.

Figure 4E:
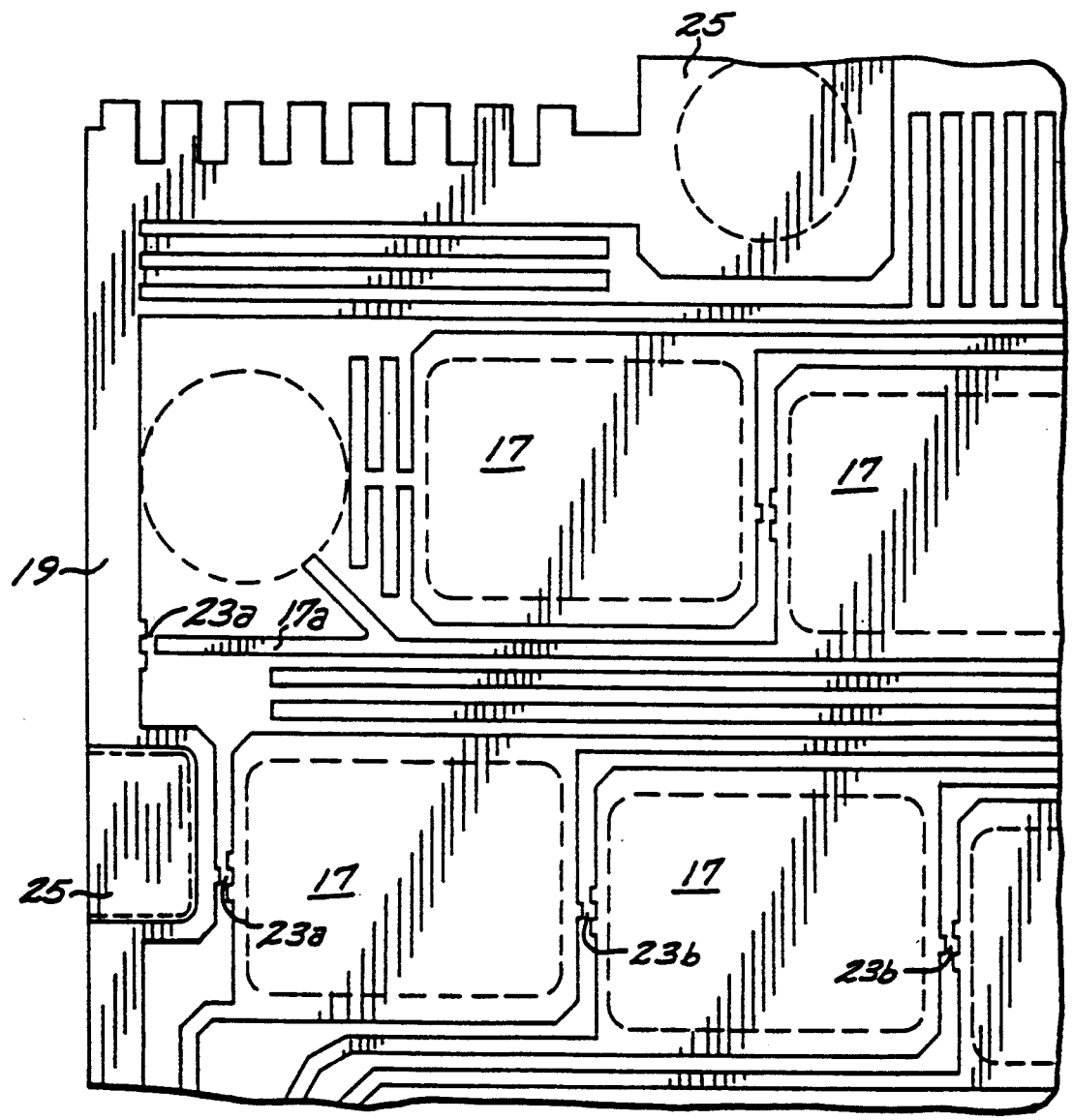
FIG. 4E is a detail view of yet another portion of the grounding metallization pattern of FIG. 4A.

Spark gaps 23a, 23b of the ESD protection structure are more particularly shown in the detail view of FIG. 4E. Each spark gap is formed by a first tab separated from a conductively connected pair of tabs located on either side of the first tab. It should be appreciated that other spark gap configurations can be utilized to provide a gap between narrow conductive tabs which provide a relatively low impedance discharge path for electrostatic energy. The intent is to provide field concentrating regions that have a field breakdown voltage that is significantly less than the breakdown voltage between adjacent conductive elements forming the interconnect lines and pads; i.e., the spark gaps are configured such that the voltage required to produce a spark in a spark gap is less than the voltage required to produce a spark between adjacent conductive interconnect elements.

There are essentially two types of spark gap discharge paths. Each of the spark gaps 23a is formed between (a) the ground ring pattern 19 or a conductive component conductively connected thereto, and (b) an interconnect pad or a conductive component connected thereto. Each of the spark gaps 23b is formed between adjacent interconnect pads 17, wherein one of the adjacent interconnect pads 17 is conductively connected to a spark gap formed with the ground ring or a conductive component connected to the ground ring pattern 19. The interconnect pads 17 are arranged in rows wherein each row includes a plurality of adjacent interconnect pads 17. In each row, spark gaps 23b are formed between adjacent pads 17, and one of the pads 17 in a given row is conductively connected to a spark gap 23a formed with the ground ring pattern 19 or a component conductively connected thereto. In this manner, discharge paths are provided between each of the interconnect pads 17 and the ground ring pattern 19 where such discharge paths present relatively low impedances for the high voltages of electrostatic discharge while providing for electrical isolation for normal operating voltages. The gaps in the spark gaps should be smaller than the closest spacing between adjacent interconnect pads or interconnect traces.

The spark gaps are preferably located as far away from the printhead as practicable so as to maximize the impedance presented by the interconnect traces between the spark gaps and the printhead.

Some of the spark gaps 23a of the first type are formed between (i) grounding pads 25 formed on the ground ring and (ii) adjacent interconnect pads 17. Other spark gaps 23a of the first type are formed between (i) grounding pads 25 interior to the grounding ring and (ii) interconnect pads adjacent thereto, wherein the grounding pads 25 interior to the ground ring pattern are connected to the ground ring pattern by appropriate conductive traces. As to those interconnect rows that do not have an adjacent grounding pad, the spark gaps 23a of the first type are formed by conductive traces 17a that extend from respective interconnect pads located at the ends of such rows.

Alternatively to the cascaded spark gaps wherein an interconnect pad forms a spark gap with an adjacent interconnect pad rather than a grounding pad, respective grounding pads can be provided for each of the interconnect pads so as to have grounded spark gaps for each of the interconnect pads.

Portions of the grounding pads 25 that form spark gaps as well as portions of other grounding pads 25 formed on the tab circuit are exposed on the front side of the tab circuit as indicated by broken line circles in FIG. 4A which represent openings in the substrate. In FIG. 5, the exposed portions of the grounding pads 25 are identified by reference numerals 25'. The grounding pad exposed portions 25' can function as discharge locations, particularly for higher voltages of electrostatic discharge.

It is noted that portions of the ground ring pattern 19 include elongated parallel interconnected traces rather than continuous metallization areas. The elongated traces as well as other portions of the tab circuit substrate allow for adhesion of the tab circuit 20 to the print cartridge by application of heat and pressure which causes to the portions of the substrate not covered by metallization to be attached to the cartridge.

The foregoing ESD protection structure generally provides protection as follows. In the ungrounded situation where there is no effective discharge path between the cartridge and an external ground plane, the ground ring pattern, the grounding patterns around openings in the substrate, and the grounding pads exposed by apertures in the substrate function as receptor sites; and the spark gaps function to prevent the potential differences between adjacent interconnects from exceeding a defined limit range known to be safe for the circuitry interconnected by the interconnect circuitry and generally determined by the gap size. For example, if a person carrying an electrostatic charge touches an interconnect pad of an ungrounded cartridge, the resulting discharge will travel through the relatively lower impedance presented by the spark gap or gaps to the ground ring metallization pattern and to the substrate ground so as to maintain the potential differences between interconnect pads at less that the defined limit range. In other words, the ESD protection circuit encourages electrostatic discharge to take predetermined paths that limit the potential differences between interconnect lines and pads.

In the grounded situation, the ground ring pattern as well as other exposed grounding components provide a discharge path to an external ground plane of electrostatic charge that may be stored in the interconnect circuitry and the interconnected elements, or electrostatic charge that is discharged to the exposed grounding components by a person handling the cartridge.

The foregoing has been a disclosure of an ESD protection structure that is external to the electronic components being protected, and is readily integrated into an existing product with re-design of the electronic components of the produce. The ESD protection structure has no moving or removable parts, and moreover aids in providing ESD protection during the manufacture of the product in which it is incorporated.

Although the foregoing has been a description and illustration of specific embodiments of the invention, various modifications and changes thereto can be made by persons skilled in the art without departing from the scope and spirit of the invention as defined by the following claims.

What is claimed is:

1. An electrostatic discharge protection structure formed on an interconnect circuit structure that includes a dielectric substrate having a printed side and a non-printed side and a pattern of openings formed therein, and elongated interconnect lines and interconnect contact pads formed on the printed side of the dielectric substrate, wherein the interconnect contact pads are formed over corresponding openings in the dielectric substrate so that the interconnect contact pads are contacted from the non-printed side through the corresponding openings, the electrostatic discharge protection structure comprising:

perimeter conductive grounding means formed on the printed side of the dielectric substrate adjacent selected edges of the perimeter of the substrate and surrounding the area occupied by the elongated interconnect lines and interconnect contact pads, said conductive grounding means being conductively connected to a ground reference;

interior conductive grounding means formed on the printed side of the dielectric substrate adjacent selected edges of openings in the substrate and conductively connected to said perimeter conductive grounding means;

conductive grounding pads formed on the printed side of the dielectric substrate over openings in the substrate so as to be subject to contact by a person from the non-printed side of the dielectric substrate and located adjacent selected interconnect pads and electrically connected to said perimeter conductive grounding means;

spark gaps formed on the printed side of the dielectric substrate between said perimeter conductive grounding means and selected ones of said interconnect contact pads which are adjacent said perimeter conductive grounding means;

spark gaps formed on the printed side of the dielectric substrate between said conductive grounding pads and said adjacent selected interconnect pads; and spark gaps formed on the printed side of the dielectric substrate between adjacent interconnect contact pads such that discharge paths to the perimeter conductive grounding means are provided for each of the interconnect contact pads.

2. The electrostatic discharge protection structure of claim 1 wherein said perimeter grounding means includes a comb like pattern of conductive material on selected portions of the periphery of said perimeter grounding means.

3. The electrostatic discharge protection structure of claim 1 wherein said perimeter grounding means includes conductive pads formed on the printed side of the dielectric substrate over openings in the substrate so as to be subject to contact by a person from the non-printed side of the dielectric substrate.

4. The electrostatic discharge protection structure of claim 1 further including conductive pads electrically connected to said perimeter grounding pattern and formed on the printed side of the dielectric substrate over openings in the substrate so as to be subject to contact by a person from the non-printed side of the dielectric substrate.

5. An electrostatic discharge protection structure formed on an interconnect circuit structure that includes a dielectric substrate having a printed side and a non-printed side and a pattern of openings formed therein, and elongated interconnect lines and interconnect contact pads formed on the printed side of the dielectric substrate, wherein the interconnect contact pads are formed over corresponding openings in the dielectric substrate so that the interconnect contact pads are contacted from the non-printed side through the corresponding openings, the electrostatic discharge protection structure comprising:

perimeter conductive grounding means formed on the printed side of the dielectric substrate adjacent selected edges of the perimeter of the substrate and surrounding the area occupied by the elongated interconnect lines and interconnect contact pads, said conductive grounding areas being conductively connected to a ground reference;

interior conductive grounding means formed on the printed side of the dielectric substrate adjacent selected edges of openings in the substrate and conductively connected to said perimeter conductive grounding means;

conductive grounding pads formed on the printed side of the dielectric substrate over openings in the substrate so as to be subject to contact by a person from the non-printed side of the dielectric substrate and located adjacent interconnect pads which are not adjacent said perimeter grounding means and electrically connected to said perimeter conductive grounding means;

spark gaps formed on the printed side of the dielectric substrate between said perimeter conductive grounding means and interconnect contact pads adjacent said perimeter grounding pattern; and spark gaps formed on the printed side of the dielectric substrate between said conductive grounding pads and said adjacent selected interconnect pads;

so that spark gaps are formed on the printed side of the dielectric substrate between each interconnect pad and either (a) the perimeter grounding means or (b) a conductive element that is conductively connected to said perimeter grounding means.

* * * * *